United States Patent
Ho et al.

(10) Patent No.: US 7,646,034 B2
(45) Date of Patent: Jan. 12, 2010

(54) SURFACE MOUNT TYPE LIGHT-EMITTING ELEMENT PACKAGE DEVICE WITH HIGH EXTRACTION EFFICIENCY DUE TO GRADUALLY VARYING INDEX OF REFRACTION AND ANTI-REFLECTIVE TOP LAYER

(75) Inventors: Hsin-Hua Ho, Miaoli County (TW); Wen-Jeng Hwang, Yun-Lin County (TW)

(73) Assignee: Lighthouse Technology Co., Ltd, Hu-Kuo, Hsin-Chu Hsien (TW)

( * ) Notice: Subject to any disclaimer, the term of this patent is extended or adjusted under 35 U.S.C. 154(b) by 153 days.

(21) Appl. No.: 11/782,639

(22) Filed: Jul. 25, 2007

(65) Prior Publication Data

US 2008/0230796 A1 Sep. 25, 2008

(30) Foreign Application Priority Data

Mar. 21, 2007 (TW) .............................. 96109725 A

(51) Int. Cl.
*H01L 33/00* (2006.01)
*H01L 27/15* (2006.01)
*H01L 31/0203* (2006.01)
*H01L 31/0216* (2006.01)
*H01L 31/0232* (2006.01)
*H01L 31/0236* (2006.01)

(52) U.S. Cl. ............................ 257/98; 257/99; 257/100; 257/E33.059; 257/E33.067; 257/E33.071; 257/E33.073

(58) Field of Classification Search .................. 257/98
See application file for complete search history.

(56) References Cited

U.S. PATENT DOCUMENTS

| | | | | |
|---|---|---|---|---|
| 5,779,924 | A * | 7/1998 | Krames et al. | 216/24 |
| 7,259,400 | B1 * | 8/2007 | Taskar | 257/98 |
| 2004/0150979 | A1 * | 8/2004 | Lambertini et al. | 362/31 |
| 2006/0068154 | A1 * | 3/2006 | Parce et al. | 428/76 |
| 2006/0220046 | A1 | 10/2006 | Yu et al. | |
| 2007/0280624 | A1 * | 12/2007 | Negley et al. | 385/146 |

OTHER PUBLICATIONS

Khasanov O.L.; Dvilis E.S.; Madison A.E.; Yu I. Smolin; Lee J.Y. "Investigation of Inhomogeneous Zirconia Nanoparticles." Key Engineering Materials Euro Ceramics VIII (2004) vol. 264-268, No. 1, pp. 431-434, 772 p.*

* cited by examiner

*Primary Examiner*—Marcos D. Pizarro
*Assistant Examiner*—Raj Gupta
(74) *Attorney, Agent, or Firm*—Winston Hsu

(57) ABSTRACT

The present invention discloses a surface mount type light-emitting diode package device and a light-emitting element package device. In the device, the encapsulation layer comprises an encapsulation material and at least one material having a refraction index different from the encapsulation material distributed therein. The distribution of the material having a refraction index different from the encapsulation material is in a way such that the refraction index of the encapsulation layer is gradually reduced from the bottom portion upward to the top portion or the inner portion outward to the outer portion of the encapsulation layer. Accordingly, a difference between the refraction indexes of two adjoining media can be reduced to eliminate a total reflection and the Fresnel loss and enhance light extraction efficiency.

6 Claims, 6 Drawing Sheets

SURFACE MOUNT TYPE LIGHT-EMITTING ELEMENT PACKAGE DEVICE WITH HIGH EXTRACTION EFFICIENCY DUE TO GRADUALLY VARYING INDEX OF REFRACTION AND ANTI-REFLECTIVE TOP LAYER

BACKGROUND OF THE INVENTION

1. Field of the Invention

The present invention relates to a light-emitting element package device, and particularly to a light-emitting element package device with a reduced total reflection and Fresnel loss.

2. Description of the Prior Art

Recently, the new application fields of light-emitting diodes (LEDs) have been developed. Different from a common incandescent light, a cold illumination LED has the advantages of low power consumption, long device lifetime, no idling time, and quick response speed. In addition, the LED also has the advantages of small size, shock resistance, being suitable for mass production, and being easily fabricated as a tiny device or an array device. A common LED package typically comprises an LED element for illumination. When light is emitted from the LED, a series of procedures including diffusing, reflecting, mixing, or light wavelength conversion proceed in a molding material or encapsulation material to generate satisfactory hues and brightness. Therefore, the selection of the molding material or encapsulating material is important to design an LED package.

As shown in FIG. 1, a conventional surface mount type (SMD) LED package device 10 is typically packaged with a transparent encapsulation material 12 to protect an LED chip 14, conducting wires (not shown), and the like disposed on a lead frame 13. The material used for the encapsulation is usually uniform and has a single refraction index. According to the theory of Fresnel loss, the light extraction efficiency equals to $4/[2+(n_1/n_2)+(n_2/n_1)]$, wherein $n_1$ and $n_2$ represent the refraction indexes of two materials bordered and having an interface therebetween. When an interface formed between two different materials, the more the difference between the two refraction indexes is, the more the Fresnel loss is. As shown in FIG. 1, when a light is emitted from the LED chip 14 (having, for example, a refraction index of 2 to 3.4) and incident onto the encapsulation material 12 through the first interface 16, or further traveled from the encapsulation material 12 (having, for example, a refraction index of 1.3 to 1.5) and incident onto the air (having, for example, a refraction index of 1) of the environmental ambiance through the second interface 18. Fresnel loss occurs at the two interfaces. Furthermore, at the interface, a total reflection loss may also occur when a light is incident onto a material having a low refraction index ($n_2$) from a material having a high refraction index ($n_1$). The light extraction efficiency is proportional to $(n_2/n_1)^2$. The term "light extraction efficiency" means the number of photons actually measured at the exterior of the light-emitting device, which are produced by the LED and remains after the absorption, refraction, and reflection by the light-emitting device per se. Generally, when two materials have an interface therebetween, the more the difference of the refraction indexes is, the more the loss of light is.

Another conventional surface mount type light-emitting diode package device 20, as shown in FIG. 2, is a multi-chip package and has a plurality of LED chips 14 emitting lights with various colors. A diffuser 22, such as, aluminum oxide and the like, is usually used and uniformly distributed in the encapsulation material 12 in order to increase color mixing. However, the light intensity, on the contrary, is decreased due to shielding effect.

Accordingly, U.S. Patent Application No. 2006/0220046A1 discloses an LED light-mixing package as shown in FIG. 3. The LED light-mixing package 30 is a surface mount type LED package comprising a package seat 32 having a holding space for holding LED chips. At least a red LED chip 34, at least a blue LED chip 35, and at least a green LED chip 36 are disposed on the package seat 32, wherein each chip is electrically connected to an electrode 33 of the package seat 32 through a wire (not shown) and may be electrically connected to an external element through the package seat 32. The LED light-mixing package 30 further comprises a sealing member 37 covering the chips and filling the holding space of the package seat 32. The LED light-mixing package 30 also comprises a plurality of diffuser particles 38 distributed in the sealing member 37. The materials of the diffuser particles 38 have high reflectivity or high light-scattering properties and are selected from the group consisting of silver, resin, silicon, and other white inorganic compounds for scattering and mixing lights. Therefore, red light, blue light, and green light emitted from the chips can be mixed to produce white light through spreading in sealing member 37 after hitting the diffuser particles 38. The diffuser particles 38 located on different positions in the sealing member 37 may have different distribution densities and amounts for providing preferable scattering routs of the three kinds of color light so as to efficiently mix light. The distribution density of the diffuser particles 38 far from the chips is greater than the distribution density of the diffuser particles 38 close to the chips. In other words, the amount of the diffuser particles 38 far from the chips is more than that close to the chips. Such diffuser particles in the LED light-mixing package are used for light mixing, and the distribution density is intentionally reduced above the chips to decrease the loss of light intensity caused by shielding effect.

However, Fresnel loss and total reflection loss still compose a large portion of the light loss of LED packages, such that an improvement of the light extraction efficiency is still desired. Therefore, there is still a need for a light-emitting element package having excellent light extraction efficiency.

SUMMARY OF THE INVENTION

One objective of the present invention is to provide a light-emitting element package device having an improved light extraction efficiency due to a reduced difference of the refraction index between two surfaces at the interface, thereby to reduce Fresnel reflection loss and total reflection loss.

The surface mount type light-emitting diode package device according to the present invention comprises a lead frame, at least one LED chip disposed on the lead frame, and a light-pervious encapsulation layer disposed on the lead frame and encapsulating the LED chip, wherein, the encapsulation layer has a bottom portion contacting the LED chip and a top portion contacting an environmental ambiance, and the encapsulation layer comprises an encapsulation material and at least one material having a refraction index different from the encapsulation material and distributed in the encapsulation material in a way such that the refraction index of the encapsulation layer is gradually reduced from the bottom portion upward to the top portion of the encapsulation layer.

In accordance with another aspect of the invention, a light-emitting element package device comprises a substrate, a light-emitting element disposed on the substrate, and a light-pervious encapsulation layer disposed on the substrate and encapsulating the light-emitting element, wherein, the encapsulation layer has an inner portion contacting the light-emitting element and an outer portion contacting an environmental ambiance, and the encapsulation layer comprises an encapsulation material and at least one material having a refraction index different from the encapsulation material and distributed in the encapsulation material in a way such that the refraction index of the encapsulation layer is gradually reduced from the inner portion outward to the outer portion of the encapsulation layer.

In the light-emitting element package device according to the present invention, one or more materials with different refraction indexes are added into the encapsulation material, based on the equivalent refraction index, to allow the encapsulation layer to have various refraction indexes therein, to reduce the difference of the refraction index at the interface for light-emitting. Accordingly, Fresnel loss and total reflection loss can be minimized, leading to good light extraction efficiency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
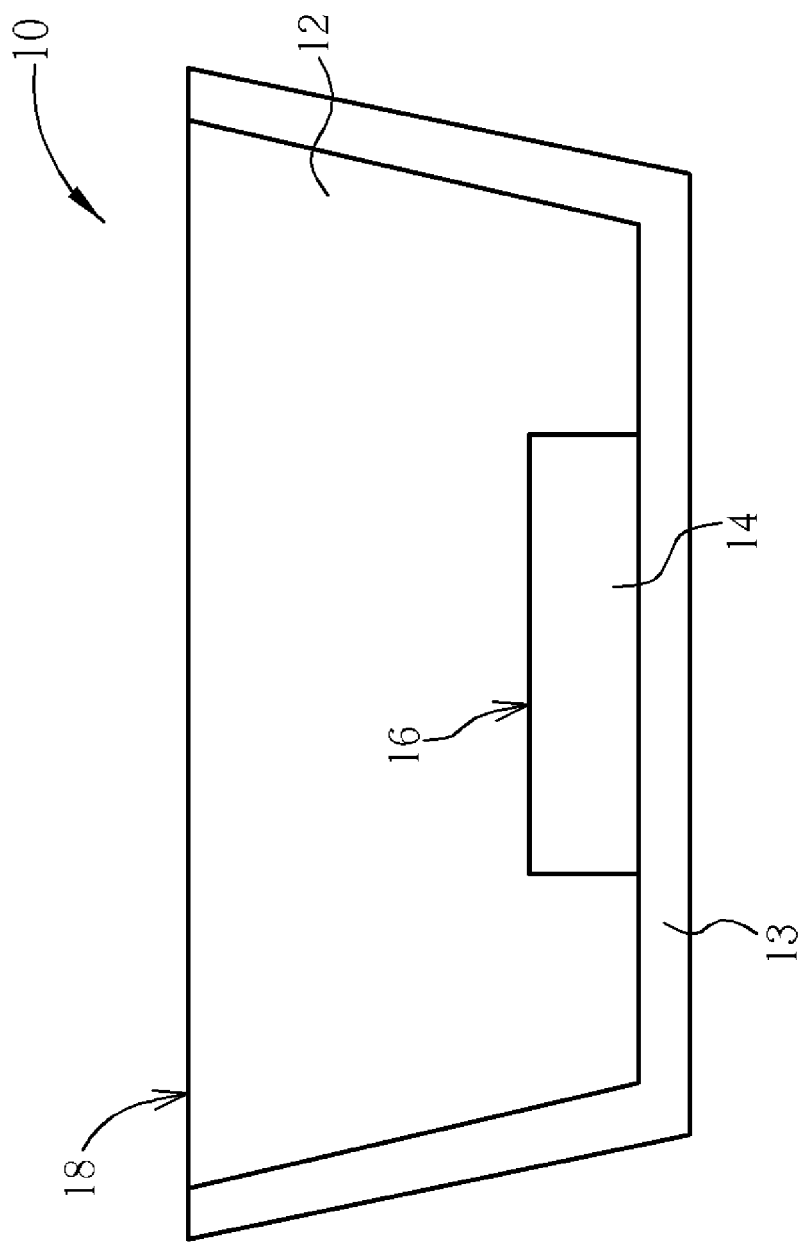
FIG. 1 is a cross-sectional view illustrating a conventional surface mount type light-emitting diode package device.
Figure 2:
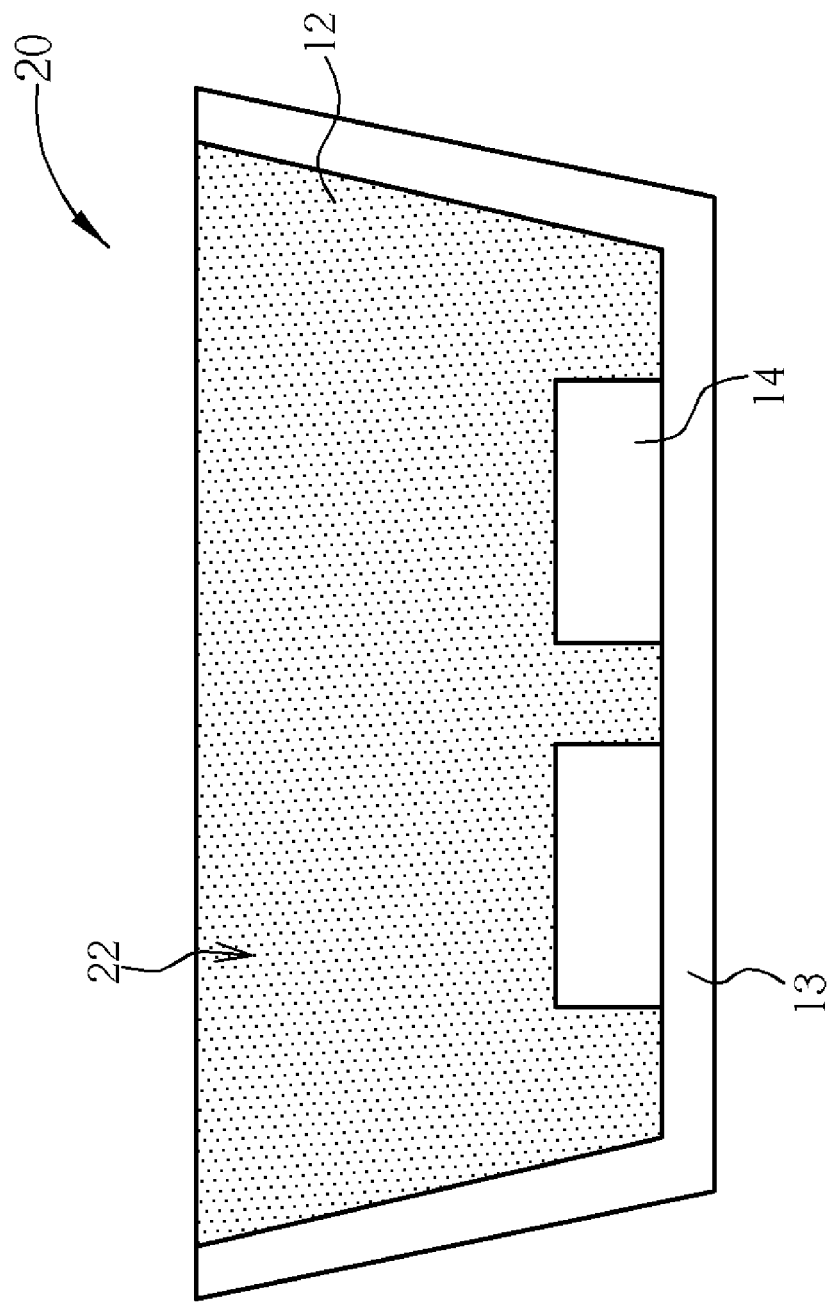
FIG. 2 is a cross-sectional view illustrating another conventional surface mount type light-emitting diode package device.
Figure 3:
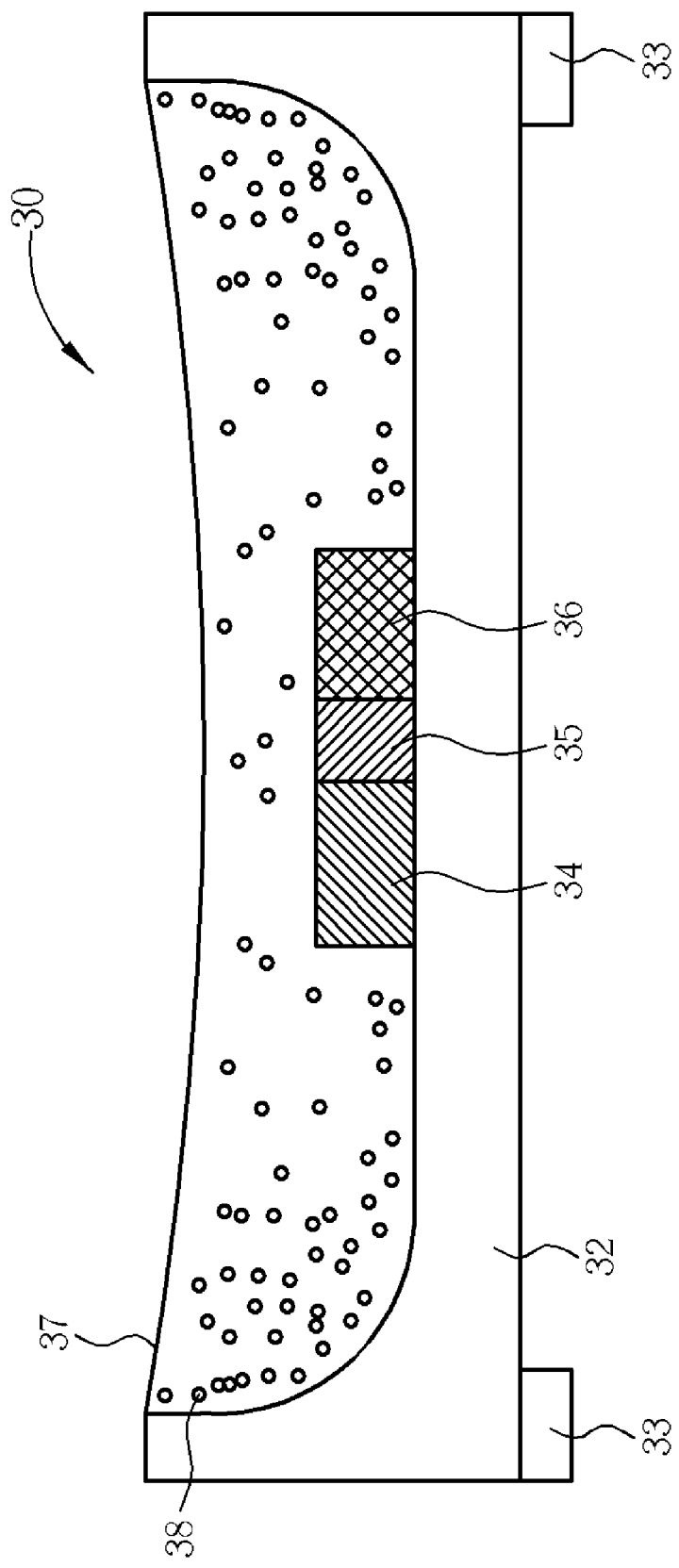
FIG. 3 is a cross-sectional view illustrating a conventional light-emitting diode light-mixing package device.
Figure 4:
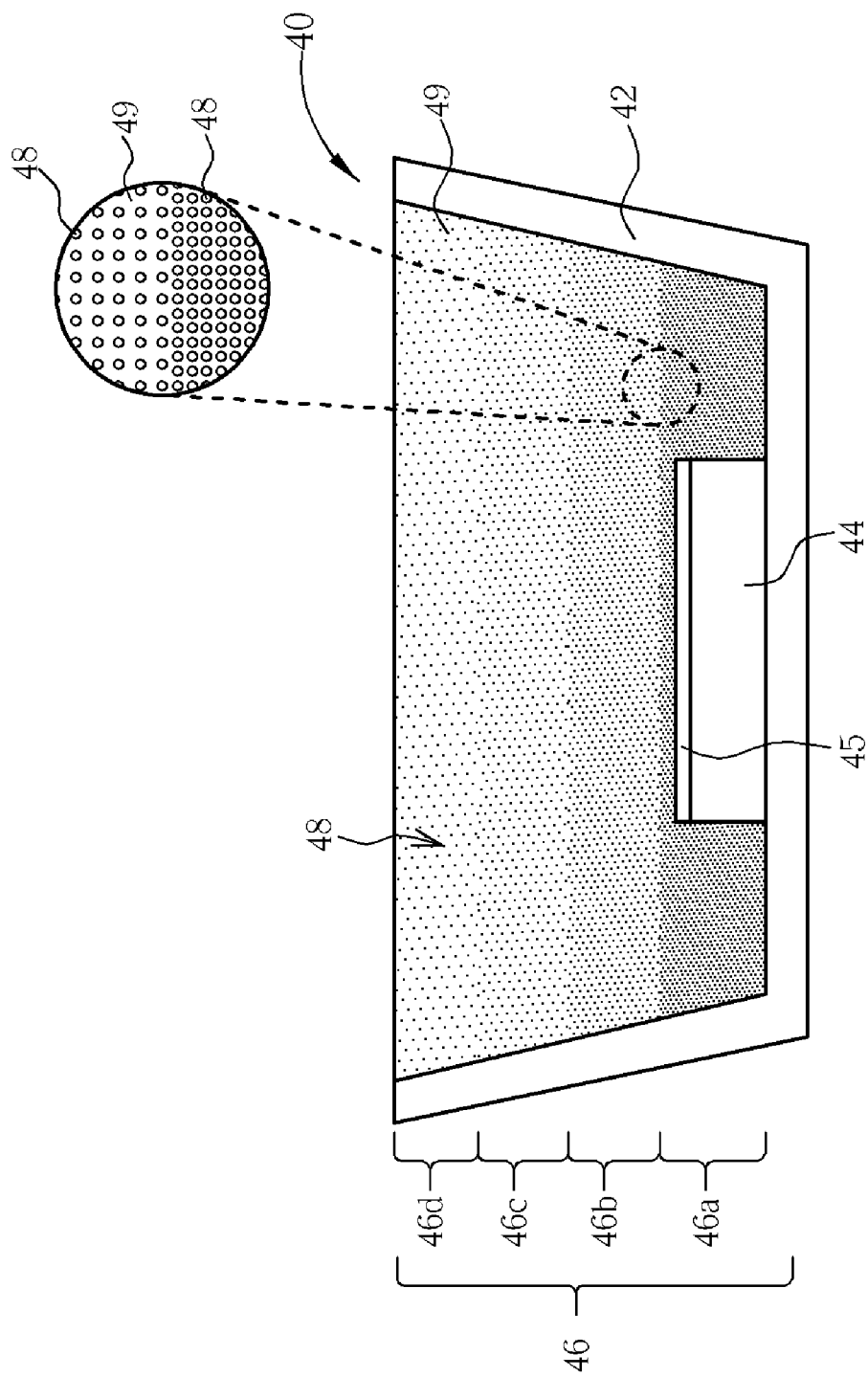
FIGS. 4-6 are cross-sectional views illustrating some embodiments of the surface mount type light-emitting diode package device according to the present invention.

Please refer to FIG. 4, showing a cross-sectional view illustrating an embodiment of the surface mount type LED package device according to the present invention. As shown in FIG. 4, the LED package device 40 comprises a lead frame 42, which has a holding space. The lead frame 42 serves as a substrate for package, and at least one LED chip 44 is disposed on the lead frame 42. A light-pervious encapsulation layer 46 disposed in the holding space of the lead frame 42 and encapsulating the LED chip 44. The encapsulation layer 46 has a bottom portion 46a contacting the LED chip 44 and a top portion 46d contacting an environmental ambiance. The encapsulation layer 46 comprises an encapsulation material 49 and a material 48 having a refraction index different from the encapsulation material 49. The material 48 is distributed in the encapsulation material 49. In this specific embodiment, the encapsulation layer 46 may be deemed as to have some portions, such as, the bottom portion 46a, the portion 46b, the portion 46c, and the top portion 46d. The distribution of the material 48 in the encapsulation material 49 is in a way leading to a result that the refraction index of each portion of the encapsulation layer 46 is gradually decreased from the bottom portion 46a upward to the top portion 46d.

In the present invention, the encapsulation material of the encapsulation layer is added a material having a refraction index different from the encapsulation material (also referred to as "different-refraction-index material", hereinafter). As a result, the portion having the encapsulation material and the different-refraction-index material exhibits a new refraction index with a value between that of the refraction index of the original encapsulation material and that of the refraction index of the added material due to the equivalence effect of the refraction index after mixing or chemical reaction of the two components. The present invention is characterized in that the encapsulation layer is formed by incorporation of a single different-refraction-index material or a plurality of various different-refraction-index materials into an encapsulation material. In which, the refraction index of the encapsulation layer is gradually decreased from the portion contacting the chip to the portion contacting the environmental ambience, or if the encapsulation layer is regarded as may portions arranged as the portion contacting the chip to the portion contacting the environmental ambience, the refraction index of each portion exhibits a trend of gradual decrease from the portion contacting the chip to the portion contacting the environmental ambience, due to the distribution status of the different-refraction-index material(s). That is, the light-pervious encapsulation layer originally exhibited a single refraction index but now exhibits a plurality of altered refraction indexes due to the addition of the different-refraction-index material(s), thereby to decrease the difference of refraction index between the encapsulation layer and the chip or the encapsulation layer and the environmental ambience, for reducing the total reflection and the Fresnel loss.

The encapsulation material used in the encapsulation layer of the present invention may include for example conventional encapsulation material, for example, light-pervious material, such as, silicone, resin, fluorinated polymer, and the like.

The different-refraction-index material of the present invention has a refraction index between the refraction index of the topmost layer of the LED chip and 1. The formation of the encapsulation layer having gradient refraction indexes may be accomplished by mixing or reacting a conventional encapsulation material with a different-refraction-index material. The different-refraction-index material may be in a solid state, liquid state, gas state or condensed state, and not particularly limited thereto. The control for the distribution of the material may be accomplished by changing the morphology and size of the material or by controlling the gravity field, electric field, or diffusion extent to result in a concentration gradient. With respect to the gravity field, when an added material has a specific gravity greater than that of a fluid, it takes advantage of Stock law that the terminal settling velocity of the material is proportional to the size of the material per se and the density difference between the material and the fluid, but inversely proportional to the viscosity of the fluid. Accordingly, when the material has a different size, the terminal settling velocity of the material will be different. Thus, varied distribution density (concentration) may be presented by controlling the size of the material and the standing time.

Preferably, the bottom portion 46a of the encapsulation layer 46 has a refraction index close to the refraction index of the topmost layer of the LED chip 44, for lowering the refraction index at the interface. Generally, the topmost layer of the LED chip 44 is a transparent electrode 45, for example, ITO (indium tin oxide) material having a refraction index of about 1.9. According, the bottom portion 46a of the encapsulation layer may have a refraction index close to 1.9, due to the addition of the material 48 having a different refraction index, to reduce the refraction index difference at the interface.

For the next portions 46b and 46c, the refraction indexes thereof may be allowed to decrease gradually by adjusting the species or the concentration difference of the different-refraction-index material distributed in the encapsulation material.

Thus, on such gradually decreased trend, the top portion 46d has a smallest refraction index among those portions. Preferably, the top portion of the encapsulation layer is allowed to have a refraction index close to the refraction index of the environmental ambiance, to reduce the refraction index difference. Typically, the environmental ambiance is air, having a refraction index of about 1. Accordingly, the top portion 46a of the encapsulation layer may have a refraction index close to 1.0 due to the addition of the material 48 having a different refraction index into the encapsulation material 49.

The encapsulation layer having gradually decreased refraction indexes is formed by adding a material having a refraction index different from the encapsulation material into the encapsulation material. This may be accomplished by, for example, selecting a material having a proper refraction index and having a specific gravity greater than that of the fluidic encapsulation material, serving as the different-refraction-index material. Such that, during the manufacture of the encapsulation layer, the different-refraction-index material can slowly sink into the encapsulation material in a colloidal state or a fluidic state, resulting in a status that the distribution density is gradually increased from the top downward to the bottom of the encapsulation layer. After the encapsulation layer in such status is hardened, the encapsulation layer is formed of an encapsulation material and a material having a different refraction index distributed in the encapsulation material with gradually decreased distribution densities.

Alternatively, the encapsulation layer having gradually decreased refraction indexes may be obtained by means of multilayer dispensing. For example, a plurality of portions of encapsulation material are separately incorporated with a different-refraction-index material in various distribution densities, and thereafter, the encapsulation material portions with different-refraction-index material added therein are each coated over the chip successively. After curing, an encapsulation layer having gradually-reduced refraction indexes can be obtained. Therefore, in accordance with the spirit of the feature, the encapsulation layer may be formed of a plurality of layers of encapsulation material or materials added with one or more different-refraction-index materials. The encapsulation materials of the layers may be same or different. The thickness of each layer is not particularly limited.

A single different-refraction-index material may be used to be distributed in the encapsulation layer with a gradually decreased distribution density. Alternatively, a plurality of various different-refraction-index materials may be used to produce an encapsulation layer with a gradually decreased refraction indexes. The various different-refraction-index materials may be for example particles with various refraction indexes or particle sizes. Therefore, with respect to a material with a certain refraction index, a suitable formulation for the encapsulation layer may be conveniently obtained by plotting the distribution density in a certain encapsulation material versus the determined equivalent refraction index. Many useful formulations may be accordingly obtained. For example, a single type of transparent diffuser particles may be distributed in an encapsulation material with gradually decreased distribution densities. Or, materials with various refraction indexes are distributed in an encapsulation material with a proper distribution density respectively, to allow the resulting encapsulation layer to have gradually decreased refraction indexes and finally a refraction index near or the same as that of the environmental ambience.

Figure 5:
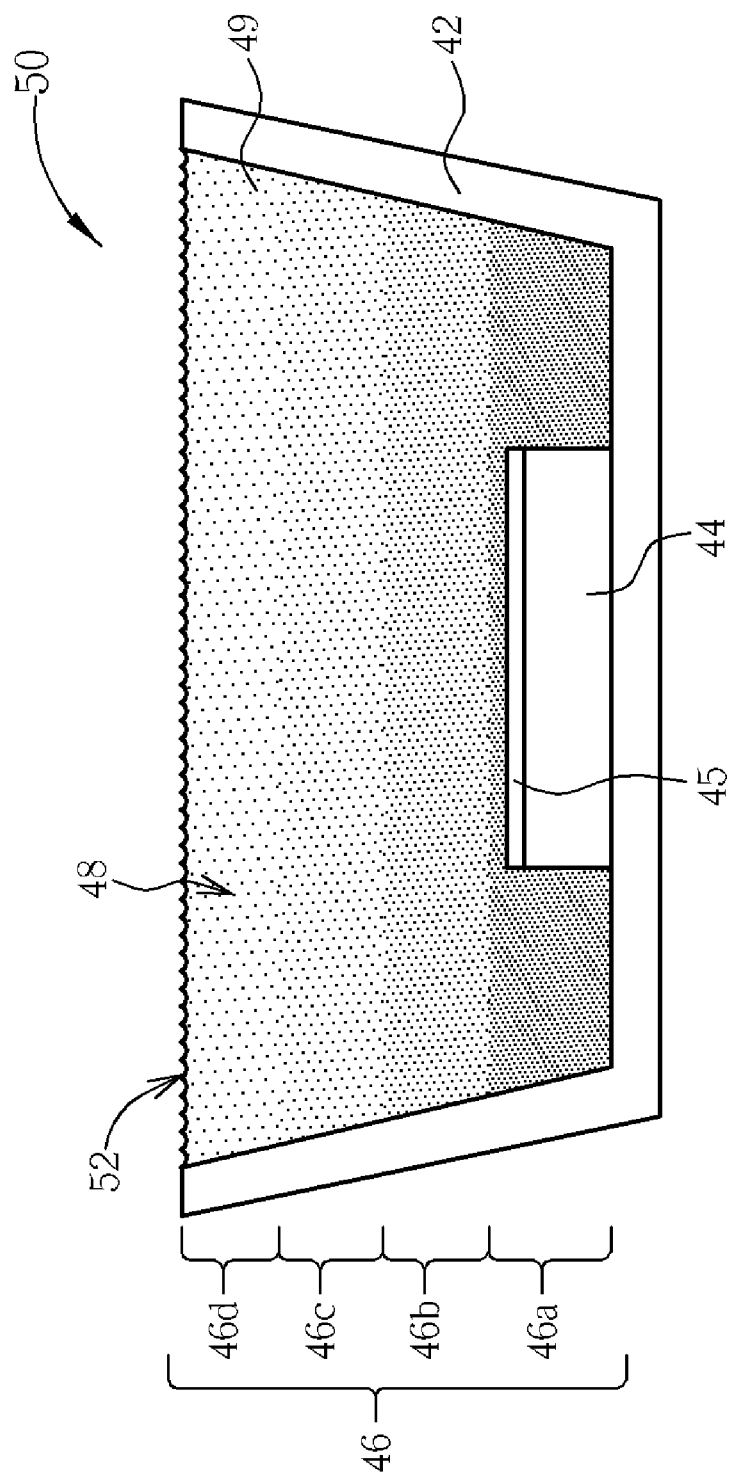

Furthermore, the top surface of the encapsulation layer 46 may further include a surface structure for preventing from total reflection. For example, in the LED package device 50 shown in FIG. 5, the surface structure of the top surface 52 is a micro-porous layer. That is, a light diffuser structure having a refraction index of about 1, such as a micro-porous structure, is formed on the surface bordering the air of the environmental ambiance. Such that, in addition that the total reflection may be further inhibited, the Fresnel loss described as the aforesaid may be also prevented, to improve the light extraction efficiency. The formation of the micro-pores may be accomplished by incorporation of volatile material, such as an organic compound, into the encapsulation material, followed by volatilization of the volatile material during the curing of the encapsulation material, to form a micro-porous structure on the surface. Alternatively, the surface structure of the top surface 52 may be a roughened structure to inhibit total reflection, to improve the light extraction efficiency.

Figure 6:
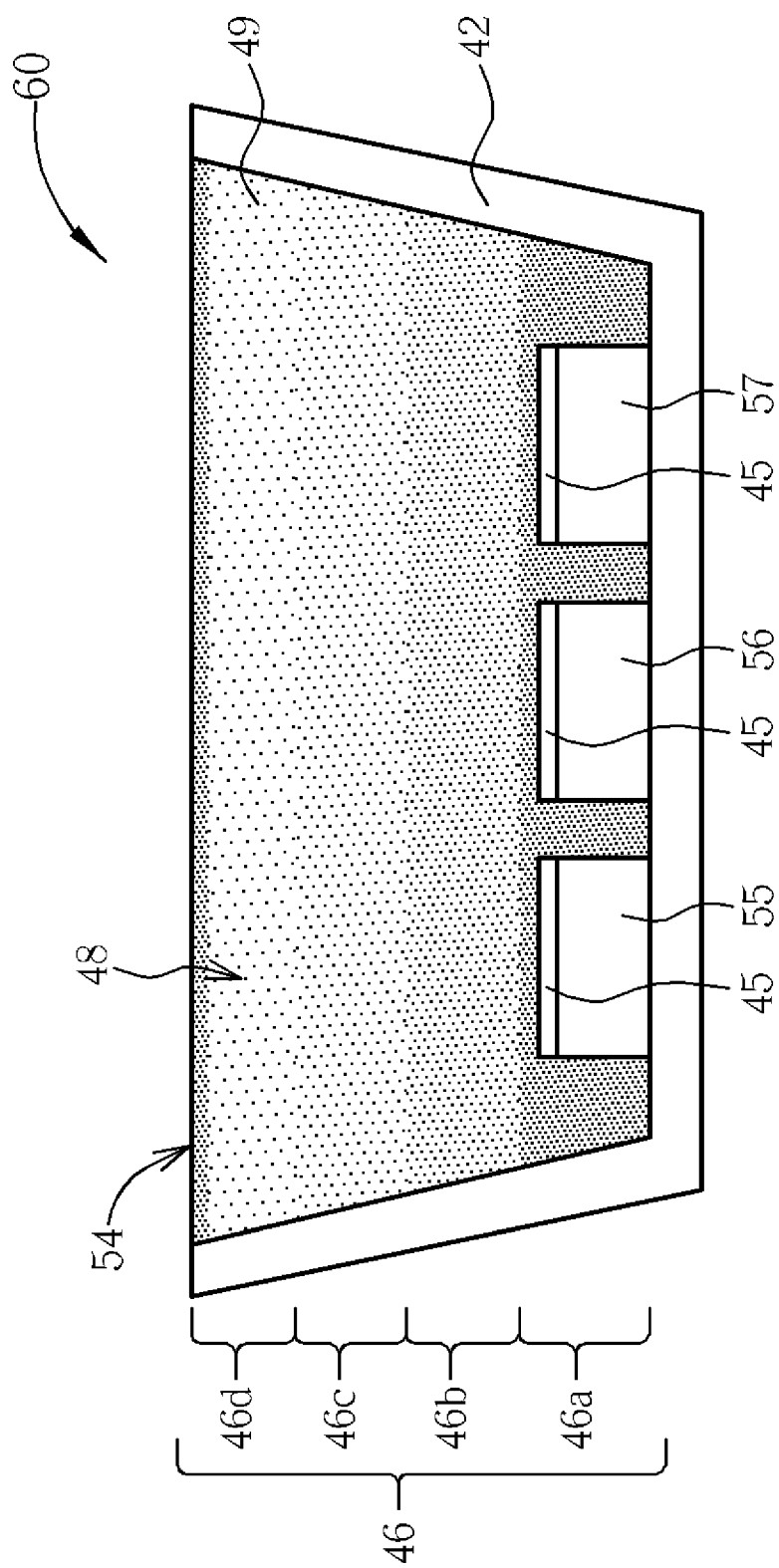

Alternatively, in the LED package device 60 as shown in FIG. 6, the distribution density of the transparent diffuser particles in the surface structure of the top surface 54 is higher than the distribution density of the transparent diffuser particles in the top portion 46d of the encapsulation layer. Accordingly, the total reflection may be prevented.

Still as shown in FIG. 6, the number of the chips may be increased to form an LED package device having multi-chips and a light mixing effect. For example, a white light LED device according to the present invention may include at least one red light-emitting diode chip 55, at least one blue light-emitting diode chip 56, and at least one green light-emitting diode chip 57.

In the above description, the present invention is explicated by an embodiment of a surface mount type LED package device. However, a light-emitting package device with a typical light-emitting element is also contemplated in accordance with the spirit of the present invention. That is, the encapsulation layer of the light-emitting package device has an inner portion contacting the light-emitting element and an outer portion contacting an environmental ambiance, the encapsulation layer is allowed to comprise one or more materials having a refraction index different from that of the encapsulation material (i.e. different-refraction-index materials), and the different-refraction-index materials are distributed in the encapsulation material in a way such that the refraction index of the encapsulation layer is gradually reduced from the inner portion outward to the outer portion of the encapsulation layer. Therefore, a lead type light-emitting package device having an LED chip or LED chips is also within the scope of the spirit of the present invention. Among them, the inner portion of the encapsulation layer preferably has a refraction index close to the refraction index of the topmost layer of the light-emitting element, and/or the outer portion of the encapsulation layer preferably has a refraction index close to the refraction index of the environmental ambiance, such that the Fresnel loss and total reflection loss can be advantageously reduced. The encapsulation layer also may comprise a plurality of encapsulation layers. For example, an innermost layer of encapsulation material is formed, and thereafter a next layer of encapsulation material is formed to envelop the innermost layer of encapsulation material. In such a way, a light-emitting element package device having a multi-encapsulation layer having different-refraction-index materials distributed therein can be obtained. The different-refraction-index material may be one distributed in the encapsulation material with a high distribution density in the inner portion of the encapsulation layer and gradually reduced to a low distribution density outward to the outer portion of the encapsulation layer. Alternatively, a plurality of different types of different-refraction-index materials may be used.

Those skilled in the art will readily observe that numerous modifications and alterations of the device and method may be made while retaining the teachings of the invention.

What is claimed is:

1. A surface mount type light-emitting diode package device, comprising:
    a lead frame;
    at least one light-emitting diode chip disposed on the lead frame; and
    a light-pervious encapsulation layer disposed on the lead frame and encapsulating the light-emitting diode chip, wherein,
        the encapsulation layer has a bottom portion contacting the light-emitting diode chip and a top portion contacting an environmental ambiance,
        the encapsulation layer comprises at least one encapsulation material and at least one material,
        the at least one material has a refraction index different from the encapsulation material and is distributed in the encapsulation material in a way such that the refraction index of the encapsulation layer is gradually reduced from the bottom portion upward to the top portion of the encapsulation layer, and
        the distribution density of the at least one material present in a surface structure of a top surface of the encapsulation layer is higher than the distribution density of the at least one material present in the portion of the encapsulation layer immediately thereebeneath.

2. The surface mount type light-emitting diode package device of claim 1, wherein the bottom portion of the encapsulation layer has a refraction index close to the refraction index of the topmost layer of the light-emitting diode chip.

3. The surface mount type light-emitting diode package device of claim 1, wherein the top portion of the encapsulation layer has a refraction index close to the refraction index of the environmental ambiance.

4. The surface mount type light-emitting diode package device of claim 1, wherein, the encapsulation layer comprises a plurality of encapsulation materials and the at least one material, the at least one material has a refraction index different from the refraction indexes of the encapsulation materials, and the at least one material is distributed in the encapsulation materials.

5. The surface mount type light-emitting diode package device of claim 1, wherein the at least one material is distributed in the at least one encapsulation material with a high distribution density at the bottom portion of the encapsulation layer and gradually reduced to a low distribution density upward to the top portion of the encapsulation layer.

6. The surface mount type light-emitting diode package device of claim 1, wherein the encapsulation layer comprises a plurality of the at least one materials having refraction indexes different from the at least one encapsulation material and different from each other.

* * * * *